(12) United States Patent
Usami (10) Patent No.: US 11,190,740 B2
(45) Date of Patent: Nov. 30, 2021

(54) PROJECTION DISPLAY APPARATUS

(71) Applicant: SONY CORPORATION, Tokyo (JP)

(72) Inventor: Kazuma Usami, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/636,693

(22) PCT Filed: Jul. 2, 2018

(86) PCT No.: PCT/JP2018/025033
§ 371 (c)(1),
(2) Date: Feb. 5, 2020

(87) PCT Pub. No.: WO2019/035281
PCT Pub. Date: Feb. 21, 2019

(65) Prior Publication Data
US 2021/0152793 A1    May 20, 2021

(30) Foreign Application Priority Data
Aug. 14, 2017  (JP) .............................. JP2017-156534

(51) Int. Cl.
*G03B 21/16* (2006.01)
*H04N 9/31* (2006.01)
(Continued)

(52) U.S. Cl.
CPC ........... *H04N 9/3144* (2013.01); *G02B 7/028* (2013.01); *G02F 1/133385* (2013.01);
(Continued)

(58) Field of Classification Search
CPC .... G03B 21/16; G03B 21/145; H04N 9/3144; F21V 29/51; F21V 29/71; F21V 29/713; F21V 29/717; F21V 29/503
See application file for complete search history.

(56) References Cited

U.S. PATENT DOCUMENTS

2008/0043439 A1   2/2008   Lin et al.
2008/0151541 A1   6/2008   Heffington et al.
(Continued)

FOREIGN PATENT DOCUMENTS

CN    104375366 A    2/2015
CN    105299603 A    2/2016
(Continued)

OTHER PUBLICATIONS

International Search Report and Written Opinion of PCT Application No. PCT/JP2018/025033, dated Sep. 18, 2018, 08 pages of ISRWO.

*Primary Examiner* — Ryan D Howard
(74) *Attorney, Agent, or Firm* — Chip Law Group (57) ABSTRACT

A projection display apparatus according to an embodiment of the present disclosure includes: a light source device; an image generation optical system that generates image light by modulating light from the light source device on the basis of an inputted image signal; and a projection optical system that projects the image light generated by the image generation optical system. The light source device includes a light source section, a radiation fin, a vapor chamber on which the light source section and the radiation fin are disposed, and a cooling fan. The light source section, the radiation fin, and the vapor chamber are disposed on a flow path of cooling gas sent out of the cooling fan.

9 Claims, 8 Drawing Sheets

(51) Int. Cl.
*G02F 1/1335* (2006.01)
*G02B 7/02* (2021.01)
*G02F 1/1333* (2006.01)
*H05K 7/20* (2006.01)

(52) U.S. Cl.
CPC ....... *G02F 1/133628* (2021.01); *G03B 21/16* (2013.01); *H05K 7/20972* (2013.01)

(56) References Cited

U.S. PATENT DOCUMENTS

| | | |
|---|---|---|
| 2015/0042963 A1 | 2/2015 | Nishimori et al. |
| 2015/0156466 A1* | 6/2015 | Nagatsu ................ G03B 21/16 353/54 |
| 2016/0025307 A1 | 1/2016 | Adema et al. |
| 2018/0180974 A1* | 6/2018 | Imaoka ................ F28D 15/046 |
| 2018/0199016 A1* | 7/2018 | Shimizu ................ H01L 23/427 |

FOREIGN PATENT DOCUMENTS

| | | |
|---|---|---|
| CN | 107065111 A | 8/2017 |
| EP | 2857897 A1 | 4/2015 |
| EP | 2980622 A1 | 2/2016 |
| HK | 1217226 A1 | 12/2016 |
| JP | 2002-076223 A | 3/2002 |
| JP | 2015-036708 A | 2/2015 |
| JP | 2016-031935 A | 3/2016 |
| TW | 200812466 A | 3/2008 |

* cited by examiner

PROJECTION DISPLAY APPARATUS

CROSS REFERENCE TO RELATED APPLICATIONS

This application is a U.S. National Phase of International Patent Application No. PCT/JP2018/025033 filed on Jul. 2, 2018, which claims priority benefit of Japanese Patent Application No. JP 2017-156534 filed in the Japan Patent Office on Aug. 14, 2017. Each of the above-referenced applications is hereby incorporated herein by reference in its entirety.

TECHNICAL FIELD

The present disclosure relates to a projection display apparatus that uses a vapor chamber, for example, as a cooling member for a light source section.

BACKGROUND ART

Recently, various projectors have been developed, which projectors have a common problem that their set volume is large. One factor that increases the set volume is area occupied by a cooling device in the projector. Furthermore, a projector that uses a solid-state light source such as a semiconductor laser (laser diode; LD) as a light source is likely to have an increased volume of the light source section as compared to a case of using a lamp as the light source.

To address this issue, for example, PTL 1 discloses a cooler including an electronic component acting as a heat source, a radiation fin including a zigzag-folded plate, and a fan that blows air toward a plate surface of the radiation fin, all of which are directly mounted on a flat heat pipe.

CITATION LIST

Patent Literature

PTL 1: Japanese Unexamined Patent Application Publication No. 2002-76223

SUMMARY OF THE INVENTION

Thus, there is a need for reducing the size of projectors. It is desirable to provide a projection display apparatus that makes it possible to reduce the size thereof.

A projection display apparatus according to an embodiment of the present disclosure includes a light source device, an image generation optical system that generates image light by modulating light from the light source device on the basis of an inputted image signal, and a projection optical system that projects the image light generated by the image generation optical system. The light source device includes a light source section, a radiation fin, a vapor chamber on which the light source section and the radiation fin are disposed, and a cooling fan. The light source section, the radiation fin, and the vapor chamber are disposed on a flow path of cooling gas sent out of the cooling fan.

In the projection display apparatus according to an embodiment of the present disclosure, the light source device includes the light source section, the radiation fin, the vapor chamber, and the cooling fan, and the vapor chamber including the light source section and the radiation fin mounted thereon is disposed on the flow path of the cooling gas sent out of the cooling fan. This improves design freedom of each member included in the light source device.

In accordance with the projection display apparatus according to an embodiment of the present disclosure, because the light source section and the radiation fin are mounted on the vapor chamber, which is disposed on the flow path of the cooling gas sent out of the cooling fan, the design freedom is improved and it is possible to reduce the size of the light source device. Thus, it is possible to reduce the size of the projection display apparatus.

It is to be noted that the effects described herein are not necessarily limiting, and there may be any of effects set forth in the present disclosure.

MODES FOR CARRYING OUT THE INVENTION

In the following, embodiments of the present disclosure are described in detail with reference to the drawings. The following description is merely a specific example of the present disclosure and the present disclosure should not be limited to the following implementations. Moreover, the present disclosure is not limited to arrangements, dimensions, dimensional ratios, and the like of each component illustrated in the drawings. It is to be noted that the description is made in the following order.

1. Embodiment (An example in which a vapor chamber as well as a light source section and a radiation fin mounted thereon are disposed on a flow path of cooling gas)
   1-1. Configuration of Light Source Device
   1-2 Configuration of Projection Display Apparatus
   1-3 Workings and Effects
2. Modification Examples

1. Embodiment

Figure 1:
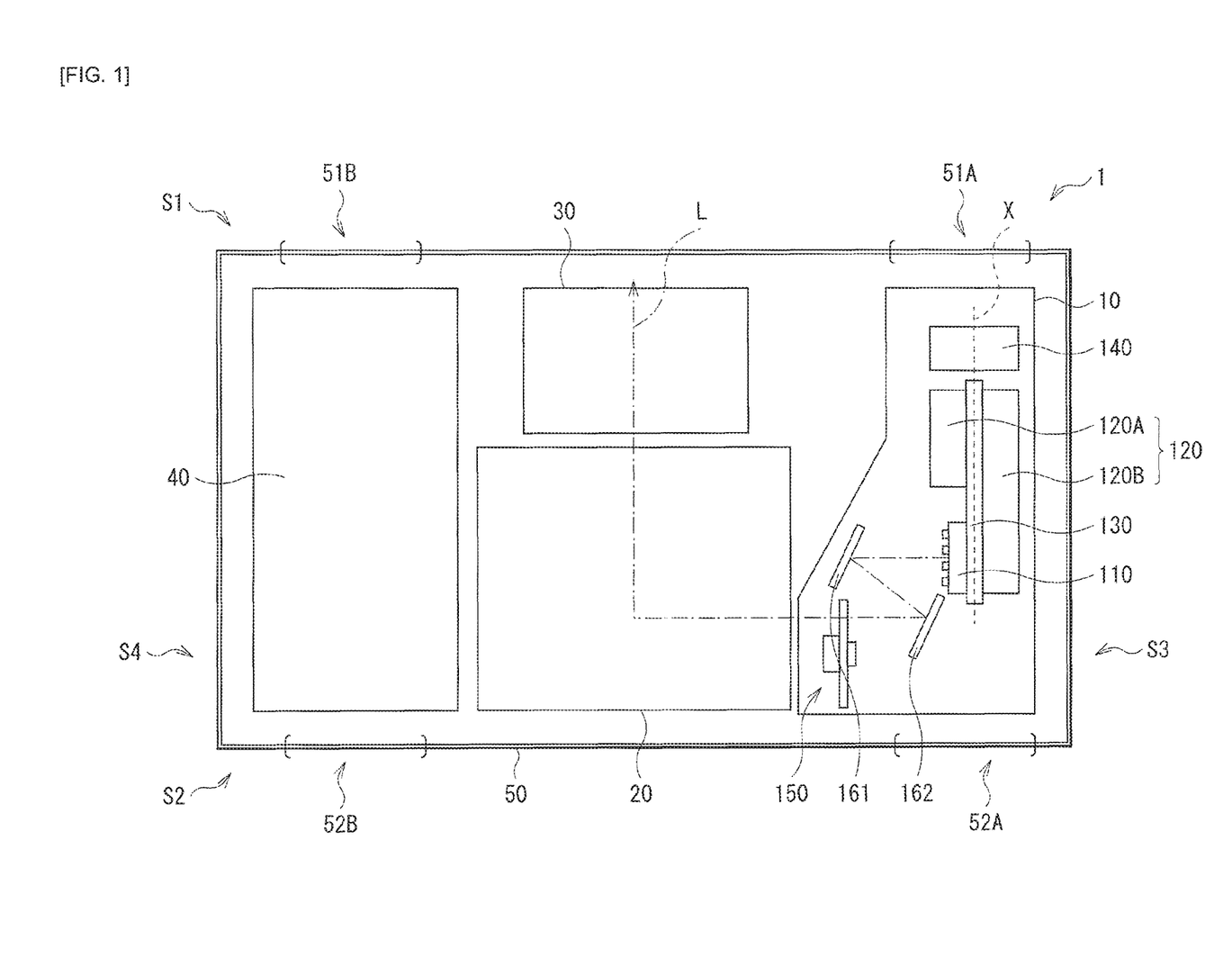
FIG. 1 is a block diagram illustrating an overall configuration of a projector according to an embodiment of the present disclosure.

FIG. 1 illustrates an overall configuration of a projection display apparatus (projector 1) according to an embodiment of the present disclosure. The projector 1 is a projection display apparatus that projects an image (image light) on a screen (not illustrated) such as a wall surface, and includes a light source device 10, an image generation optical system 20, a projection optical system 30, a power supply unit 40, and a housing 50 that houses the light source device 10, the image generation optical system 20, the projection optical system 30, and the power supply unit 40. The light source device 10 includes, for example, a light source section 110, a light converter (phosphor wheel 150), and a cooler (cooling fan 140) that cools the light source section 110. In the present embodiment, the light source section 110 is mounted on a vapor chamber 130 together with a radiation fin 120. The light source device 10 has a configuration in which the light source section 110, the radiation fin 120, and the vapor chamber 130 are disposed on a flow path of cooling gas sent out of the cooling fan 140.

(1-1. Configuration of Light Source Device)

Figure 2:
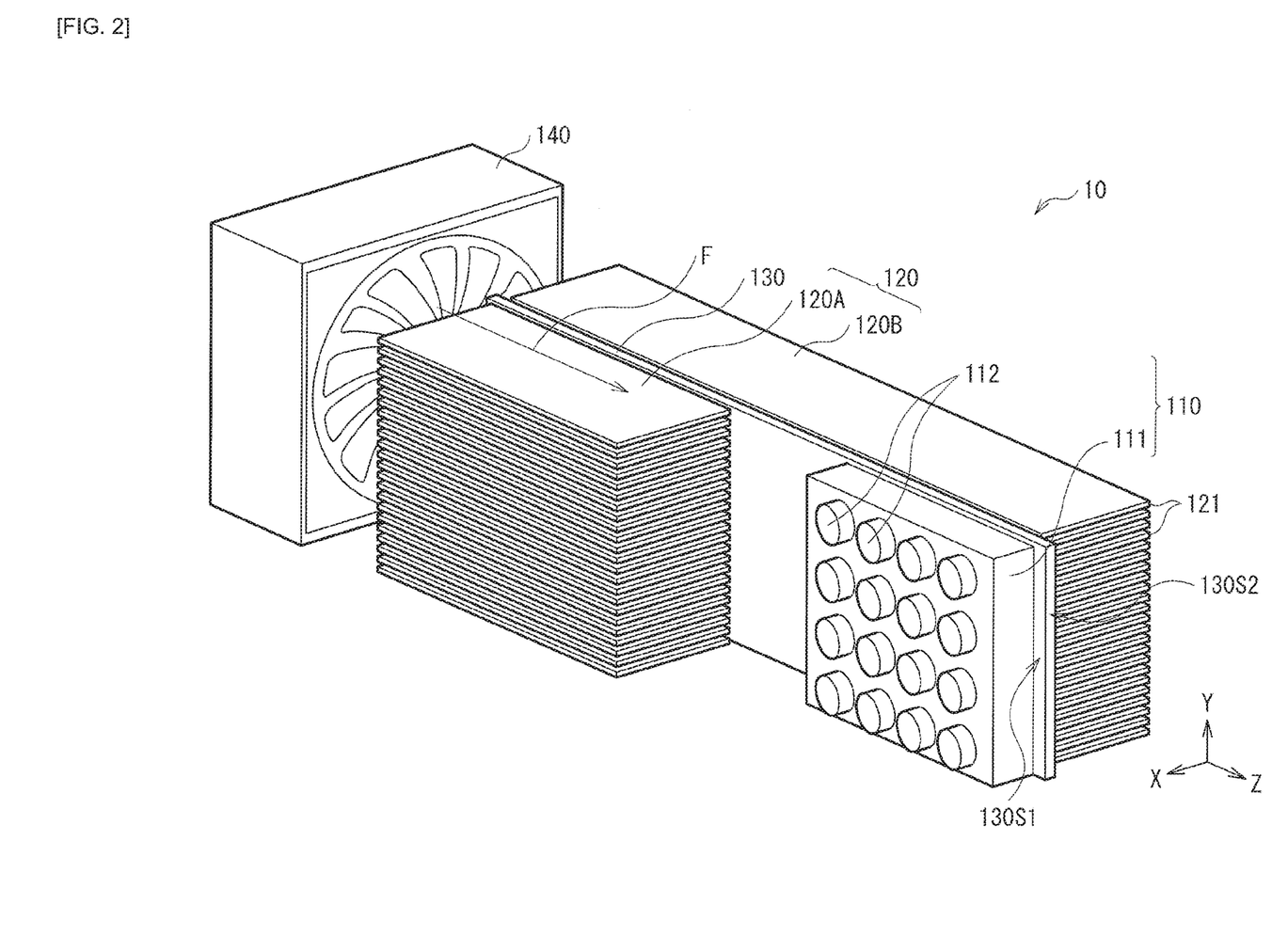
FIG. 2 is a perspective view of a configuration of a main portion of a light source device illustrated in FIG. 1.

FIG. 2 perspectively illustrates a configuration of a main portion of the light source device 10 illustrated in FIG. 1. The light source device 10 according to the present embodiment includes, for example, the light source section 110, the cooling fan 140, the vapor chamber 130, and the cooling fan 140. As described above, the light source section 110 and the radiation fin 120 are mounted on the vapor chamber 130, which are disposed on the flow path of the cooling gas sent out of the cooling fan 140.

The light source section 110 includes a plurality of semiconductor laser elements 112 disposed on a seat 111 including aluminum (Al), for example. The semiconductor laser element 112 oscillates laser light having a wavelength of 445 nm or 455 nm, for example.

The radiation fin 120 is a laminate of a plurality of fins 121. The plurality of fins 121 is laminated in a substantially vertical direction (for example, Y-axis direction) with respect to a blowing direction F (for example, Z-axis direction) of the cooling gas sent out of the cooling fan 140, and the cooling gas is allowed to pass through between the fins 121. The fin 121 preferably includes a material having high thermal conductivity, and desirably includes a pure aluminum-based material, copper (Cu), carbon (C), or the like, for example. In the present embodiment, for example, two radiation fins 120A and 120B are respectively disposed on a first surface (surface 130S1) and a second surface (surface 130S2), which are opposed to each other, of the vapor chamber 130 having a rectangular shape, for example.

Figure 3:
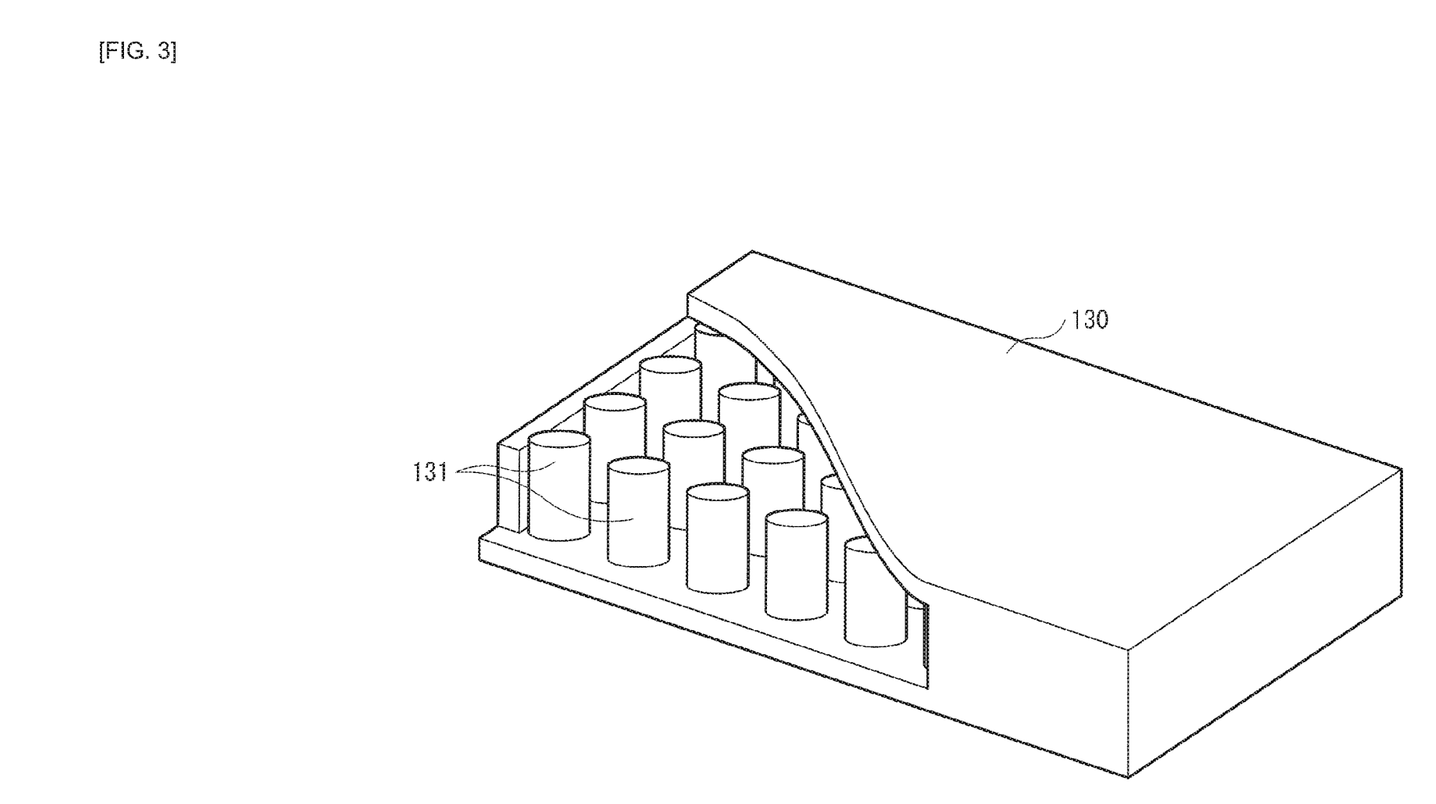
FIG. 3 is a schematic view for illustrating an internal structure of a vapor chamber.

The vapor chamber 130 is a plate-like heatsink having a hollow structure. FIG. 3 schematically illustrates an internal structure of the vapor chamber 130. The vapor chamber 130 includes a plurality of wicks 131 in a columnar shape, for example, arranged in parallel in the internal hollow, and further includes a small amount of volatile liquid such as water encapsulated therein. In the vapor chamber 130, the encapsulated liquid is vaporized by heat from a heat source (here, the light source section 110), and the vapor moves in the space to be cooled on the heatsink surface and returned to liquid. The vapor chamber 130 facilitates thermal diffusion using the gas-liquid phase change. The vapor chamber 130 preferably includes the material having high thermal conductivity as with the seat 111 of the light source section 110 and the radiation fin 120, and desirably includes copper (Cu), for example.

Figure 10:
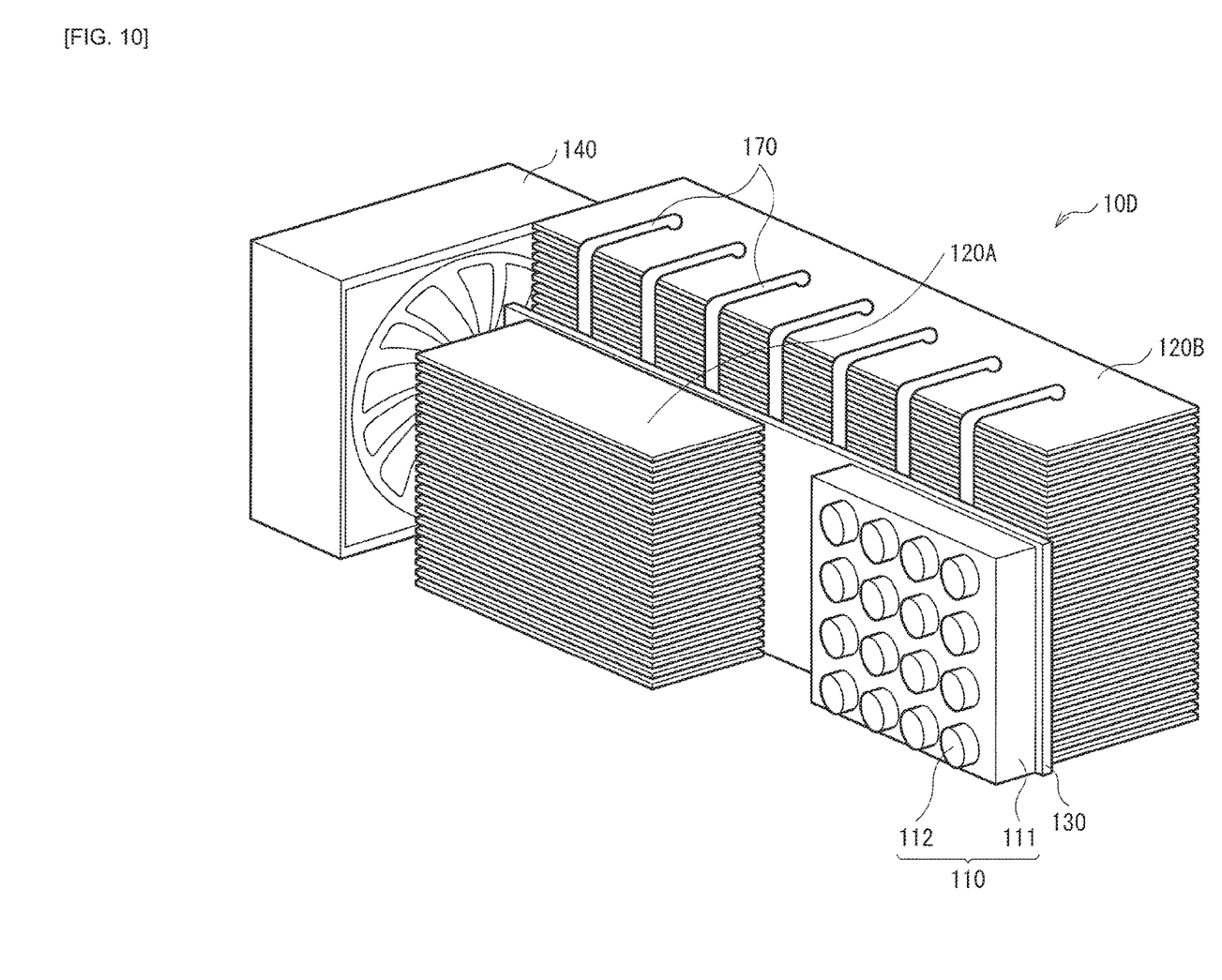
FIG. 10 is a perspective view of a configuration of a main portion of a light source device according to Modification Example 3 of the present disclosure.

The cooling fan 140 cools the radiation fin 120 and the vapor chamber 130. Moreover, the light source section 110 is also cooled by the cooling gas having passed through the radiation fins 120A. The cooling fan 140 may be, for example, a typical axial fan as illustrated in FIG. 10. The size of the cooling fan 140 is preferably substantially equivalent to that of a surface of the vapor chamber 130 facing the cooling fan 140. This makes it possible to achieve high cooling efficiency.

In the light source device 10 according to the present embodiment, the light source section 110 is disposed on the surface 130S1 of the vapor chamber 130. The radiation fin 120A is further disposed on the surface 130S1 of the vapor chamber 130, and the radiation fin 120B is disposed on the entire surface 130S2 opposed to the surface 130S1, for example. As for the light source section 110 and the radiation fin 120A, for example, it is preferable that the radiation fin 120A is disposed upstream of the flow path of the cooling gas sent out of the cooling fan 140 and the light source section 110 is disposed downstream of the flow path. That is, the radiation fin 120A is preferably disposed between the cooling fan 140 and the light source section 110. This improves radiation efficiency of the radiation fin 120A and improves efficiency in cooling the light source section 110 by the vapor chamber 130. Moreover, disposing the light source section 110 on the flow path of the cooling gas enables direct cooling by the cooling gas sent out of the cooling fan 140, in addition to cooling by the vapor chamber 130. Accordingly, it is possible to suppress an increase in temperature of the light source section 110.

Moreover, in the present embodiment, as illustrated in FIG. 1, the vapor chamber 130 is preferably disposed on a center axis X of the cooling fan 140. This allows the cooling gas to pass through between the plurality of fins 121 that configure the radiation fins 120A and 120B respectively disposed on the surface 130S1 and the surface 130S2 of the vapor chamber 130. Moreover, the vapor chamber 130 is preferably disposed at the center of a blowing range of the cooling gas sent out of the cooling fan 140 (on the center axis X of the cooling fan 140). This enables efficient heat exhaust. It is to be noted that each of the light source section 110 and the radiation fins 120A and 120B is fixed to the vapor chamber 130 by means of solder joint, for example.

Figure 4:
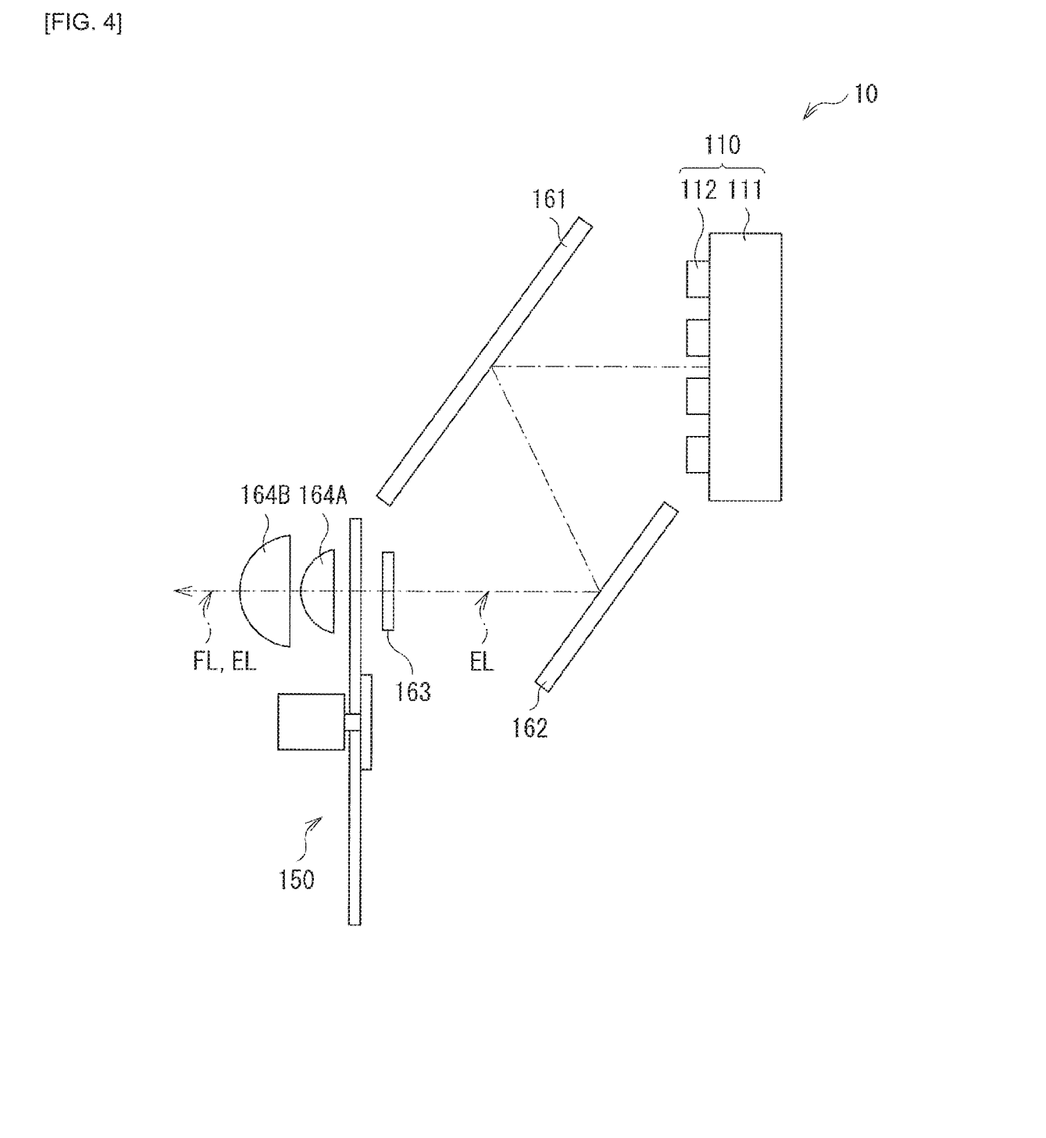
FIG. 4 is an outline diagram illustrating an example of a configuration of the light source device illustrated in FIG. 1.

FIG. 4 illustrates an example of a configuration of the light source device 10. In addition to the light source section 110, the radiation fin 120, the vapor chamber 130, and the cooling fan 140 described above, the light source device 10 includes the phosphor wheel 150, reflective mirrors 161 and 162, a diffusion plate 163, and a plurality of lenses 164A and 164B that guide light (fluorescence FL) converted by the phosphor wheel 150 and light (excitation light EL) passed through the phosphor wheel 150 to the image generation optical system 20.

Figure 5A:
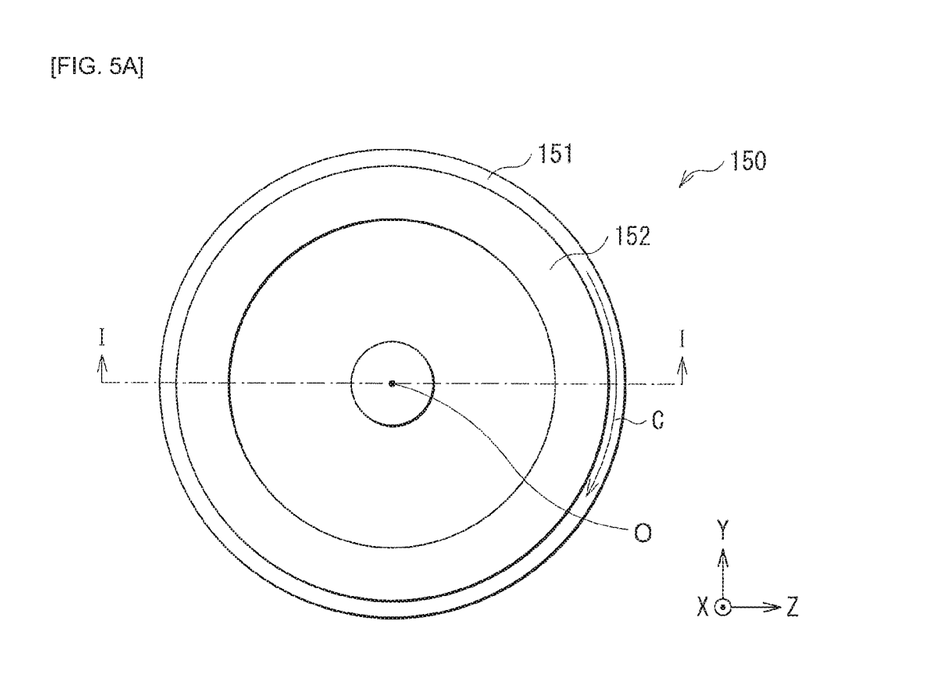
FIG. 5A is a schematic plan view of a phosphor wheel.
Figure 5B:
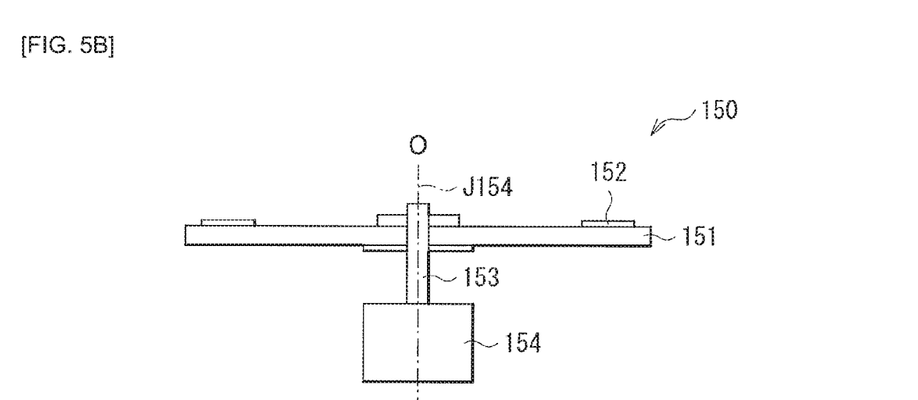
FIG. 5B is a schematic cross-sectional view of the phosphor wheel illustrated in FIG. 5A.

FIG. 5A illustrates a planar configuration of the phosphor wheel 150, and FIG. 5B illustrates a cross-sectional configuration of the phosphor wheel 150 taken along line I-I illustrated in FIG. 5A. The phosphor wheel 150 includes, for example, a disk-shaped substrate 151, and a phosphor layer 152 is disposed on the substrate 151. A motor 154 is coupled to the substrate 151 via a shaft 153, and the motor 154 enables the substrate 151 to rotate around an axis J154 running through a center O of the substrate 151 in a direction of an arrow C.

The phosphor layer 152 includes, for example, a phosphor particle as a fluorescent substance, and has an annular shape. The phosphor particle is granular phosphor that absorbs excitation light EL1 applied from the outside and emits the fluorescence FL. As the phosphor particle, for example, a fluorescent substance is used that emits yellow fluorescence (light in a wavelength range between a red wavelength range and a green wavelength range) when excited by blue laser light having a wavelength in a blue wavelength range (e.g., 400 nm to 470 nm). One example of such a fluorescent substance is, for example, YAG (yttrium aluminum garnet)-based material.

In the present embodiment, the phosphor wheel 150 is disposed to allow the excitation light EL emitted from the light source section 110 to be reflected by the reflective mirrors 161 and 162 in this order, then pass through the diffusion plate 163 and fall on the phosphor layer 152. The phosphor wheel 150 is, for example, a transmissive light conversion element, which converts the excitation light EL applied from the light source section 110 into the fluorescence FL to fall on a rear surface side of the substrate 151 (image generation optical system 20). It is to be noted that a cooling fan (not illustrated) that removes heat generated by a phosphor layer 12 accompanying irradiation of the excitation light EL1 is desirably provided in the light source device 10 separately.

(1-2 Configuration of Projection Display Apparatus)

Figure 6:
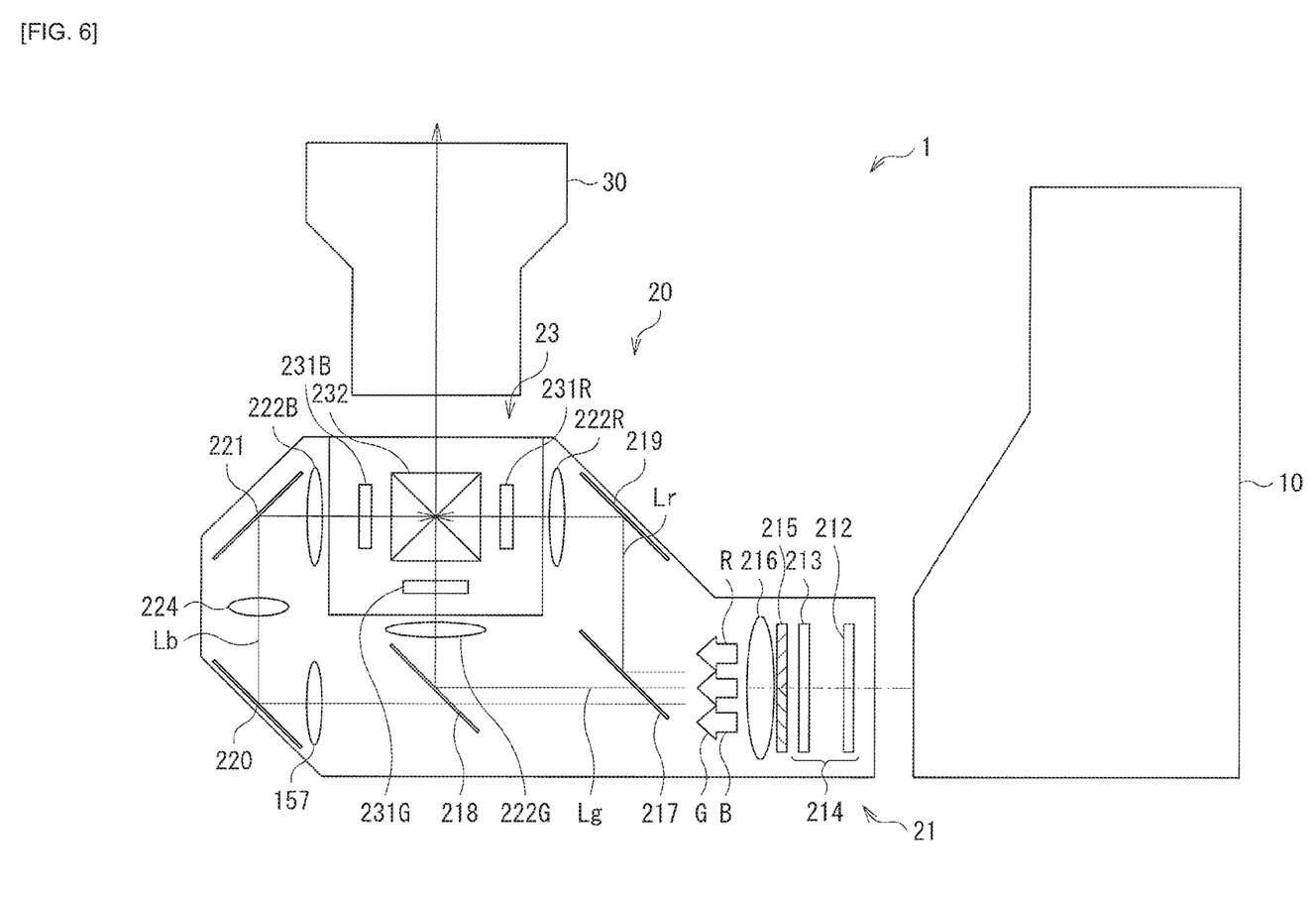
FIG. 6 is an outline diagram illustrating an example of the overall configuration of the projector illustrated in FIG. 1.

FIG. 6 illustrates an example of an overall configuration of each optical system included in the projector 1. The projector 1 according to the present embodiment includes, as described above, the light source optical system (light source device 10), the image generation optical system 20, and the projection optical system 30. The image generation optical system 20 includes an image generation element 23 that generates an image on the basis of applied light, and an illumination optical system 21 that applies the light emitted from the light source device 10 to the image generation element 23. The projection optical system 30 projects the image generated by the image generation element 23.

It is to be noted that the following description is made with reference to an example of a transmissive 3-LCD projector that modulates light using a transmissive liquid crystal panel (LCD). However, the phosphor wheel 150 is also applicable to a projector using a reflective liquid crystal panel, a digital micro-mirror device (DMD), or the like, instead of the transmissive liquid crystal panel.

As illustrated in FIG. 6, the illumination optical system 21 includes, for example, an integrator element 214, a polarization conversion element 215, and a condenser lens 216. The integrator element 214 includes a first fly-eye lens 212 including a plurality of microlenses two-dimensionally arranged and a second fly-eye lens 213 including a plurality of microlenses each of which is arranged to correspond to each of the microlenses of the first fly-eye lens 212 on a one-to-one basis.

Light (parallel light) entering the integrator element 214 from the light source device 10 is split by the microlenses of the first fly-eye lens 212 into a plurality of beams, each forming an image on the corresponding microlens of the second fly-eye lens 213. Each of the microlenses of the second fly-eye lens 213 functions as a secondary light source that applies a plurality of parallel light beams with equal luminance to the polarization conversion element 215 as incident light.

The integrator element 214 as a whole has a function of smoothing the incident light applied from the light source device 10 to the polarization conversion element 215 into a uniform luminance distribution.

The polarization conversion element 215 has a function of equalizing a polarization state of the incident light entering via the integrator element 214. The polarization conversion element 215 emits outgoing light including blue light B, green light G, and red light R via the condenser lens 216 or the like disposed on an emission side of the light source device 10, for example.

The illumination optical system 21 further includes dichroic mirrors 217 and 218, mirrors 219, 220, and 221, relay lenses 223 and 224, field lenses 222R, 222G, and 222B, transmissive liquid crystal panels (liquid crystal light valves 231R, 231G, and 231B) as image generation elements, and a dichroic prism 232.

The dichroic mirrors 217 and 218 have a property of selectively reflecting color light in a predetermined wavelength range and transmitting light in other wavelength ranges. With reference to FIG. 6, for example, the dichroic mirror 217 selectively reflects the red light R (Lr). The dichroic mirror 218 selectively reflects the green light G (Lg) out of the green light G and the blue light B having passed through the dichroic mirror 217. The remaining blue light B (Lb) passes through the dichroic mirror 218. This allows the light (white light Lw) emitted from the light source device 10 to be split into a plurality of color light beams of different colors.

The split red light Lr is reflected by the mirror 219, collimated while passing through the field lens 222R, and then enters the liquid crystal light valve 231R for modulation of the red light. The green light Lg is collimated while passing through the field lens 222G, and then enters the liquid crystal light valve 231G for modulation of the green light. The blue light Lb passes through the relay lens 223 to be reflected by the mirror 220, and further passes through the relay lens 224 to be reflected by the mirror 221. The blue light Lb reflected by the mirror 221 is collimated while passing through the field lens 222B, and then enters the liquid crystal light valve 231B for modulation of the blue light Lb.

The liquid crystal light valves 231R, 231G, and 231B are electrically coupled to an unillustrated signal source (e.g., a PC) that supplies an image signal containing image information. The liquid crystal light valves 231R, 231G, and 231B modulate incident light with respect to each pixel and respectively generate a red image, a green image, and a blue image on the basis of the supplied image signals of respective colors. The modulated light beams of respective colors (formed images) enter the dichroic prism 232 to be combined. The dichroic prism 232 overlays and combines the light beams of respective colors entered from three directions, and emits the resulting light toward the projection optical system 30.

The projection optical system 30 includes a plurality of lenses, enlarges the outgoing light from the image generation element 23, and projects the resulting light on a screen (not illustrated) or the like.

As described above, the projector 1 includes the light source device 10, the image generation optical system 20, the projection optical system 30, the power supply unit 40, and the housing 50. In the housing 50, the light source device 10, the image generation optical system 20, and the projection optical system 30 are arranged in a U-shape, for example, and the power supply unit 40 is disposed beside them.

In the power supply unit 40, for example, a power supply board, an LD driver that drives the semiconductor laser element 112 of the light source section 110, and the like are disposed. The power supply unit 40 may be disposed along either left or right side surface (side surface S4 in FIG. 1) in the housing 50, for example.

The housing 50 has a substantially rectangular parallelepiped shape, for example, and has a front surface (surface S1) confronting the screen, a rear surface (surface S2)

opposed to the front surface S1, and opposite side surfaces S3 and S4 between the front surface S1 and the rear surface S2, for example.

The housing 50 is provided with two inlet ports 51A and 51B that take in air for cooling the inside of the housing 50 on the surface S1, for example, and two outlet ports 52A and 52B that exhaust the air from the inside of the housing 50 on the surface S2, for example, respectively. The inlet port 51A and the outlet port 52A and the inlet port 51B and the outlet port 52B are respectively disposed opposed to each other, for example. In the projector 1, the light source device 10 is disposed between the inlet port 51A and the outlet port 52A, and the power supply unit 40 is disposed between the inlet port 51B and the outlet port 52B. For example, respective exhaust fans (not illustrated) are disposed between the light source device 10 and the outlet port 52A and between the power supply unit and the outlet port 52B. This forms two flows of air moving straight from the front surface (surface S1) toward the rear surface (surface S2) in the housing 50 and efficiently exhausts the air having been warmed by the light source device 10 and the power supply unit 40, which are large heat sources in the housing 50, to the outside.

It is to be noted that the inlet ports 51A and 51B may not necessarily be disposed on the surface S1 nor the outlet ports 52A and 52B on the surface S2. The inlet ports 51A and 51B may be disposed on the surface S2 and the outlet ports 52A and 52B on the surface S1.

(1-3. Workings and Effects)

As described above, the projectors have a common problem that their set volume is large. One factor for increasing the set volume should be area occupied by the cooling device in the projector.

In general, a heatsink including a fin is used as the cooling device. With such a heatsink, the farther away from the heat source, the more the radiation performance tends to degrade. Moreover, because the position in which the fin is disposed is restricted by the heat source position to a certain degree, the structure is limited. There is a heatsink combined with a heat pipe as a cooling device improved in this regard. However, a structural restriction of the heat pipe limits the direction in which the heat pipe is allowed to be routed from the heat source.

Furthermore, the projector using a solid-state light source such as a semiconductor laser (LD) as the light source tends to have a larger volume of the light source section compared to the projector using a lamp as the light source. This makes it difficult to reduce the size of the projector.

To address this issue, in the projector 1 according to the present embodiment, the light source device 10 includes the light source section 110, the radiation fin 120, the vapor chamber 130, and the cooling fan 140, and the vapor chamber 130 having the light source section 110 and the radiation fin 120 disposed thereon is disposed on the flow path of the cooling gas sent out of the cooling fan 140. This improves design freedom of each member included in the light source device 10.

As described above, in the present embodiment, the light source section 110 and the radiation fin 120 are disposed on the vapor chamber 130, which is disposed on the flow path of the cooling gas sent out of the cooling fan 140. In this manner, using the vapor chamber 130 improves the design freedom of each member included in the light source device 10 and makes it possible to reduce the size of the light source device 10. It is thus possible to provide the projector 1 that makes it possible to reduce the size thereof.

Moreover, in the present embodiment, as described above, the light source section 110, the radiation fin 120, and the vapor chamber 130 are disposed on the flow path of the cooling gas sent out of the cooling fan 140. This allows the cooling gas sent out of the cooling fan 140 to blow not only against the radiation fin 120 and the vapor chamber 130 but also against the light source section 110, making it possible to cool all of the light source section 110, the radiation fin 120, and the vapor chamber 130 by the cooling fan 140. Furthermore, in the present embodiment, using the vapor chamber 130 makes it possible to dispose the radiation fin 120A and the radiation fin 120B respectively on both the surface (surface 130S1) where the light source section 110 is mounted and the surface 130S1 opposed to the surface 130S1. Accordingly, it is possible to improve the radiation performance of the light source device 10 and the projector 1 including the light source device 10.

Still further, in the present embodiment, the radiation fin 120A is disposed between the cooling fan 140 and the light source section 110. This allows cold air (cooling gas) taken in through the inlet port 51A of the housing 50, for example, to blow against the radiation fin 120A first. Accordingly, it is possible to efficiently cool the radiation fin 120A, thereby improving the radiation efficiency of the radiation fin 120A and the vapor chamber 130. That is, it is possible to further improve the radiation performance of the light source device 10 and the projector 1 including the light source device 10.

From the above, the projector 1 according to the present embodiment makes it possible to further reduce power consumption. The projector 1 also makes it possible to improve low-noise performance.

2. Modification Example

Next, Modification Examples (Modification Examples 1 to 3) of the above-described embodiment are described. In the following, components similar to those of the above-described embodiment are denoted with the same reference numerals, and descriptions thereof are omitted where appropriate.

Modification Example 1

Figure 7:
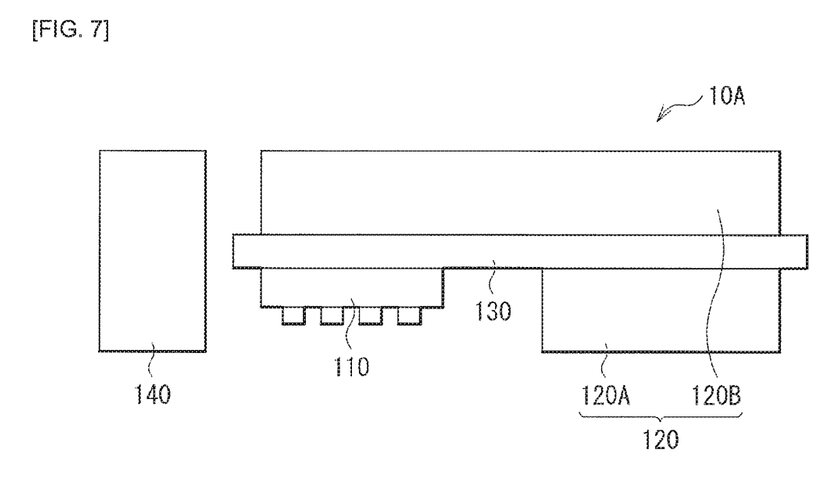
FIG. 7 is a block diagram illustrating a configuration of a main portion of a light source device according to Modification Example 1 of the present disclosure.

FIG. 7 illustrates a configuration of a main portion of a light source device (light source device 10A) included in a projection display apparatus (projector 1) according to Modification Example 1 of the present disclosure. Although the above-described embodiment presents an example in which the light source section 110 and the radiation fin 120A disposed on the surface 130S1 of the vapor chamber 130 are disposed in the order of the radiation fin 120A and then light source section 110 from side of the cooling fan 140, it is not limiting. For example, as illustrated in FIG. 7, the light source section 110 and the radiation fin 120A may be disposed in this order from side of the cooling fan 140.

Modification Example 2

Figure 8:
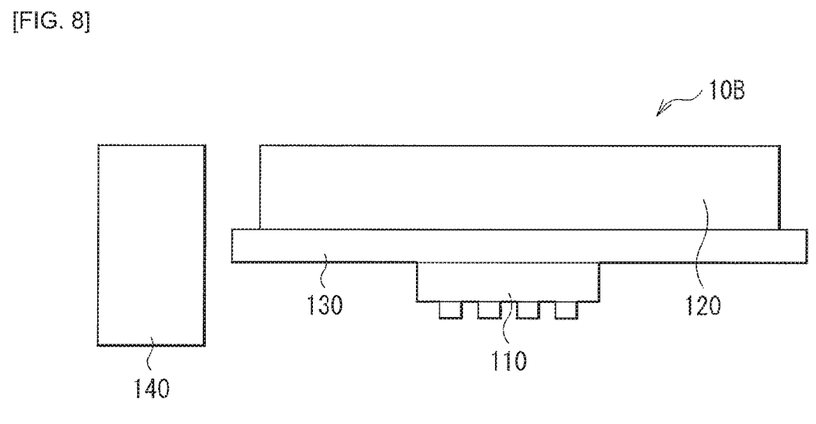
FIG. 8 is a block diagram illustrating an example of a configuration of a main portion of a light source device according to Modification Example 2 of the present disclosure.

FIG. 8 illustrates a configuration of a main portion of a light source device (light source device 10B) included in a projection display apparatus (projector 1) according to Modification Example 2 of the present disclosure. Although the above-described embodiment presents an example in which the surface 130S1 and the surface 130S2 of the vapor chamber 130 are respectively provided with the radiation fin 120A and the radiation fin 120B, it is not limiting. For example, as illustrated in FIG. 8, the light source section 110 may be disposed on the surface 130S1 of the vapor chamber 130 and the radiation fin 120 may be disposed only on the surface 130S2 of the vapor chamber 130.

Figure 9:
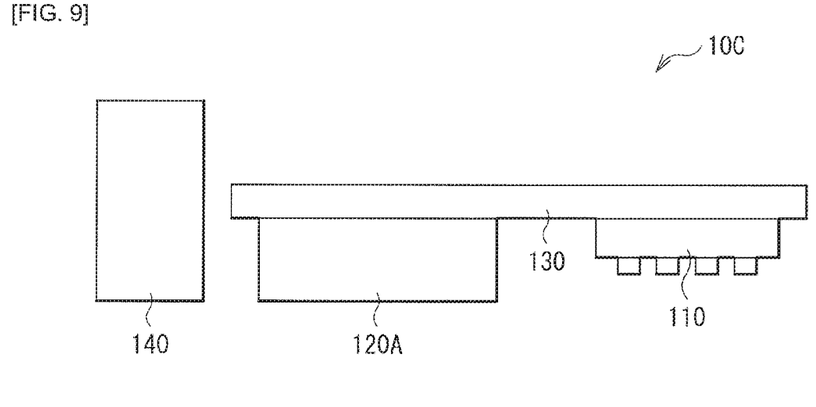
FIG. 9 is a block diagram illustrating another example of the configuration of the main portion of the light source device according to Modification Example 2 of the present disclosure.

Moreover, as with a light source device 10C illustrated in FIG. 9, the radiation fin 120 may be provided only on the surface 130S1 of the vapor chamber 130 to be disposed in parallel with the light source section 110.

It is to be noted that cooling of the light source section 110 and the vapor chamber 130 becomes more efficient when more cooling gas flows between the plurality of fins 121 included in the radiation fin 120 disposed on the vapor chamber 130. Therefore, for example, for the light source device 10B and the light source device 10C, it is preferable to shift the vapor chamber 130 from the center axis X of the cooling fan 140 and dispose the corresponding radiation fin 120 near the center axis X of the cooling fan 140.

Modification Example 3

FIG. 10 illustrates a configuration of a main portion of a light source device (light source device 10D) included in a projection display apparatus (projector 1) according to Modification Example 3 of the present disclosure. The light source device 10D according to the present modification example is, for example, a combination of the radiation fin 120B disposed on side of the surface 130S2 of the vapor chamber 130 and a heat pipe 170.

In this manner, the light source device 10 according to the present disclosure may further use the heat pipe 170 as a cooling member. This makes it possible to efficiently transfer heat that the vapor chamber 130 absorbs from the light source section 110 to the radiation fin 120B via the heat pipe 170. Accordingly, it is possible to further improve the radiation performance in the projector 1.

Although the present technology has been described above with reference to the embodiment and modification examples, the present technology is not limited to the above-described embodiment and the like and may be modified in a variety of ways. Although the description has been made specifically with reference to the components of each optical system in the above-described embodiment, not all the components may necessarily be included, and other components may be further included.

For example, although the above-described embodiment illustrates an example in which the light source device 10 includes the light source section 110 and the light converter (phosphor wheel 150) that converts the wavelength of the laser light (e.g., excitation light EL1) emitted from the light source section 110, the present disclosure is not limited thereto. For example, the light source device 10 may use, as a direct light source, a light emitting element that emits white light including red light (R), blue light (B), and green light (G) required for color image display. Such a light emitting element includes, for example, a solid-state light source such as a semiconductor laser (LD) and a light emitting diode (LED).

Moreover, although the above-described embodiment illustrates an example of using the rectangular vapor chamber, the present disclosure is not limited thereto. For example, a T-shaped or cross-shaped vapor chamber may be used.

Furthermore, for example, the projector 1 illustrated in FIG. 6 may use a polarization beam splitter (PBS), a color combination prism that combines image signals of each color of RGB, or a total internal reflection (TIR) prism may be used instead of the dichroic prism 232.

Still further, as the projection display apparatus according to the present technology, an apparatus other than the above-described projector may be configured.

It is to be noted that the present disclosure may also have the following configurations.

(1)
A projection display apparatus including:
a light source device;
an image generation optical system that generates image light by modulating light from the light source device on the basis of an inputted image signal; and
a projection optical system that projects the image light generated by the image generation optical system, in which
the light source device includes
a light source section,
a radiation fin,
a vapor chamber on which the light source section and the radiation fin are disposed, and
a cooling fan, and
the light source section, the radiation fin, and the vapor chamber are disposed on a flow path of cooling gas sent out of the cooling fan.

(2)
The projection display apparatus according to (1), in which
the radiation fin is disposed between the cooling fan and the light source section.

(3)
The projection display apparatus according to (1) or (2), in which
the light source section is disposed between the cooling fan and the radiation fin.

(4)
The projection display apparatus according to any one of (1) to (3), in which
the radiation fin includes a plurality of fins each having a plate-like shape, the plurality of fins being laminated in a substantially vertical direction with respect to a blowing direction of the cooling gas sent out of the cooling fan.

(5)
The projection display apparatus according to any one of (1) to (4), in which
the vapor chamber has a first surface provided with the light source section and a second surface opposed to the first surface, and
the radiation fin is disposed on the first surface.

(6)
The projection display apparatus according to any one of (1) to (4), in which
the vapor chamber has a first surface provided with the light source section and a second surface opposed to the first surface, and
the radiation fin is disposed on the second surface.

(7)
The projection display apparatus according to any one of (1) to (4), in which
the vapor chamber has a first surface provided with the light source section and a second surface opposed to the first surface, and
the radiation fin is disposed on both the first surface and the second surface of the vapor chamber.

(8)
The projection display apparatus according to any one of (1) to (7), further including a heat pipe.

(9)
The projection display apparatus according to any one of (1) to (8), in which the light source device further includes a light converter rotatable around an axis of rotation.

This application claims the benefit of Japanese Priority Patent Application JP 2017-156534 filed with the Japanese Patent Office on Aug. 14, 2017, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A projection display apparatus, comprising:
a light source device configured to emit light;
an image generation optical system configured to:
modulate, based on an image signal, the light emitted from the light source device; and
generate image light based on the modulation; and
a projection optical system configured to project the image light generated by the image generation optical system, wherein
the light source device includes:
a light source section,
a radiation fin,
a vapor chamber, wherein
the vapor chamber has a first surface and a second surface opposed to the first surface, and
the light source section and the radiation fin are on the first surface of the vapor chamber, and
a cooling fan configured to output cooling gas, and
the light source section, the radiation fin, and the vapor chamber are on a flow path of the cooling gas.

2. The projection display apparatus according to claim 1, wherein the radiation fin is between the cooling fan and the light source section.

3. The projection display apparatus according to claim 1, wherein the light source section is between the cooling fan and the radiation fin.

4. The projection display apparatus according to claim 1, wherein
the radiation fin includes a plurality of fins,
each of the plurality of fins has a plate-like shape, and
each of the plurality of fins is laminated in a substantially vertical direction with respect to a blowing direction of the cooling gas.

5. The projection display apparatus according to claim 1, wherein
the radiation fin is on both the first surface and the second surface of the vapor chamber.

6. The projection display apparatus according to claim 1, further comprising a heat pipe.

7. The projection display apparatus according to claim 1, wherein the light source device further includes a light converter rotatable around an axis of rotation.

8. A projection display apparatus, comprising:
a light source device configured to emit light;
an image generation optical system configured to:
modulate, based on an image signal, the light emitted from the light source device; and
generate image light based on the modulation; and
a projection optical system configured to project the image light generated by the image generation optical system, wherein
the light source device includes:
a light source section,
a radiation fin,
a vapor chamber, wherein the light source section and the radiation fin are on the vapor chamber, and
a cooling fan configured to output cooling gas,
the light source section is between the cooling fan and the radiation fin, and
the light source section, the radiation fin, and the vapor chamber are on a flow path of the cooling gas.

9. A projection display apparatus, comprising:
a light source device configured to emit light;
an image generation optical system configured to:
modulate, based on an image signal, the light emitted from the light source device; and
generate image light based on the modulation; and
a projection optical system configured to project the image light generated by the image generation optical system, wherein
the light source device includes:
a light source section,
a radiation fin,
a vapor chamber, wherein
the vapor chamber has a first surface and a second surface opposed to the first surface,
the light source section is on the first surface of the vapor chamber, and
the radiation fin is on both the first surface and the second surface of the vapor chamber, and
a cooling fan configured to output cooling gas, and
the light source section, the radiation fin, and the vapor chamber are on a flow path of the cooling gas.

* * * * *